United States Patent
Kuo

(10) Patent No.: US 7,883,975 B2
(45) Date of Patent: Feb. 8, 2011

(54) METHOD FOR FABRICATING A NON-VOLATILE MEMORY INCLUDING CONVERTING A SILICON LAYER-WHICH FORMED OVER A STACKED STRUCTURE HAVING A CHARGE STORAGE LAYER-INTO AN INSULATING LAYER

(75) Inventor: Ming-Chang Kuo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 12/615,450

(22) Filed: Nov. 10, 2009

(65) Prior Publication Data

US 2010/0055890 A1 Mar. 4, 2010

Related U.S. Application Data

(62) Division of application No. 12/015,939, filed on Jan. 17, 2008, now abandoned.

(51) Int. Cl.
*H01L 21/4763* (2006.01)
*H01L 29/788* (2006.01)

(52) U.S. Cl. .................................... 438/288; 438/770
(58) Field of Classification Search ................. 438/258, 438/288, 770
See application file for complete search history.

(56) References Cited

U.S. PATENT DOCUMENTS

| | | | | |
|---|---|---|---|---|
| 6,011,725 | A * | 1/2000 | Eitan | 365/185.33 |
| 6,204,530 | B1 * | 3/2001 | Choi | 257/315 |
| 7,015,541 | B2 * | 3/2006 | Kim et al. | 257/324 |
| 7,071,061 | B1 * | 7/2006 | Pittikoun | 438/267 |
| 7,501,679 | B2 * | 3/2009 | Kwak | 257/316 |
| 2006/0145244 | A1 * | 7/2006 | Kwon | 257/317 |

* cited by examiner

*Primary Examiner*—Anh D Mai
(74) *Attorney, Agent, or Firm*—J.C. Patents

(57) ABSTRACT

A method for fabricating a non-volatile memory is provided. The method includes a stacked structure and a consuming layer are formed in sequence over a substrate. A converting process is performed at a peripheral region of the consuming layer to form a first insulating layer. A conductive layer is formed over the stacked layer and the first insulating layer.

15 Claims, 19 Drawing Sheets

METHOD FOR FABRICATING A NON-VOLATILE MEMORY INCLUDING CONVERTING A SILICON LAYER-WHICH FORMED OVER A STACKED STRUCTURE HAVING A CHARGE STORAGE LAYER-INTO AN INSULATING LAYER

CROSS-REFERENCE TO RELATED APPLICATION

This application is a divisional application of and claims the priority benefit of U.S. application Ser. No. 12/015,939, filed on Jan. 17, 2008, now pending. The entirety of the above-mentioned patent applications is hereby incorporated by reference herein and made a part of this specification.

BACKGROUND OF THE INVENTION

1. Field of the Invention

The present invention relates to methods for fabricating an integrated circuit (IC). More particularly, present invention relates to methods for fabricating a non-volatile memory.

2. Description of Related Art

A non-volatile memory is characterized by maintaining stored data even when the power is off, and thus has become a mandatory device in many electronic products for providing normal operation when the electronic products are booted. Recently, the non-volatile memory has been widely adopted in personal computers (PCs) and other electronic equipment.

FIG. 1 is a schematic cross-sectional view of a conventional non-volatile memory. Referring to FIG. 1, the non-volatile memory includes a substrate 100, a source region 102a and a drain region 102b disposed in the substrate 100, and a gate stacked structure 112. The gate stacked structure 112 is constituted by a silicon oxide layer 104, a silicon nitride layer 106, another silicon oxide layer 108, and a gate 110 all having a uniform thickness. In the conventional non-volatile memory, one bit is respectively stored in the silicon nitride layer 106 around the source region 102a and the drain region 102b, such that a two-bit/cell memory is formed.

However, when programming the conventional two-bit/cell non-volatile memory, the two bits in the same memory cell are mutually affected. If one bit has been stored in a part near the drain region in the conventional non-volatile memory, a second-bit effect occurs when a reading operation is performed, such that a voltage in the portion where a high current is expected may drop. In other words, when the memory cell is being read, the existing bit poses a direct impact on the memory cell, thus increasing a barrier and a threshold voltage (Vt) for reading.

In view of the above, the second-bit effect not only substantially implicates the operation of devices, but also reduces the device reliability. Moreover, because the second-bit effect reduces a sense margin and a Vt window for operating the left bit and the right bit, thus an operation of multi-level cell memory is more difficult.

One of the current solutions is directed to increasing a drain voltage (Vd) for enhancing a drain-induced barrier lowering (DIBL), and thereby the increased barrier and the increased Vt arisen from the second-bit effect can be decreased. Nevertheless, since a dimension of the device is continuously shrinking, an excessive drain voltage will result in the operation difficulties as well.

SUMMARY OF THE INVENTION

In light of the foregoing, the present invention is directed to a non-volatile memory capable of reducing a second-bit effect and resolving problems derived therefrom.

The present invention is further directed to several methods for fabricating a non-volatile memory capable of preventing cross interference of two bits in a memory cell of the non-volatile memory, such that the reliability of a memory device is enhanced.

The present invention provides a method for fabricating a non-volatile memory. The method includes forming a stacked structure and a consuming layer in sequence over a substrate at first. A converting process is performed at a peripheral region of the consuming layer to form a first insulating layer. A conductive layer is formed over the stacked layer and the first insulating layer.

According to another embodiment of the present invention, the stacked structure includes a second insulating layer and a charge storage layer over the substrate.

According to another embodiment of the present invention, before the conductive layer is formed, the method further comprises removing the consuming layer and forming a third insulating layer over the first insulating layer and the charge storage layer.

According to another embodiment of the present invention, the stacked structure further includes a third insulating layer formed over the charge storage layer.

A thickness of the third insulating layer ranges from 80 angstrom to 100 angstrom, while a thickness of the first insulating layer ranges from 10 angstrom to 20 angstrom. A thickness of the second insulating layer ranges from 50 angstrom to 60 angstrom. A thickness of the charge storage layer ranges from 60 angstrom to 80 angstrom.

According to another embodiment of the present invention, the charge storage layer is a dielectric material providing charge trapping ability and the dielectric material is nitride material that comprising silicon nitride.

According to another embodiment of the present invention, the converting process is an oxidation process.

According to another embodiment of the present invention, the method further includes before the converting process is performed, a mask layer is formed over a center region of the consuming layer. In addition, after the converting process is performed, the mask layer is removed. The mask layer comprises silicon nitride. In another embodiment, the method further includes a fourth insulating layer is formed on the first insulating layer.

According to another embodiment of the present invention, the consuming layer is a conductive layer. The conductive layer includes a polysilicon layer.

According to another embodiment of the present invention, the method further includes a mask layer is formed over a center region of the stacked structure before the consuming layer is formed. Thereafter, the converting process is performed to remove the consuming layer at a top surface of the mask layer and to remain the consuming layer at the peripheral region of the stacked structure so as to form the first insulating layer. Afterward, the mask layer is removed.

According to another embodiment of the present invention, the consuming layer is an insulating material.

In the present invention, the stacked structure comprising the insulating layer/the charge storage layer/the insulating layer is disposed between the conductive layer and the substrate. The insulating layer disposed between the conductive layer and the dielectric layer has a greater thickness of the peripheral region than the thickness of the internal region of the insulating layer. Accordingly, the thickness of the peripheral region of the insulating layer results in a greater DIBL, which effectively reduces the second-bit effect. On the other hand, the non-volatile memory of the present invention can be further applied to a multi-bit memory device.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
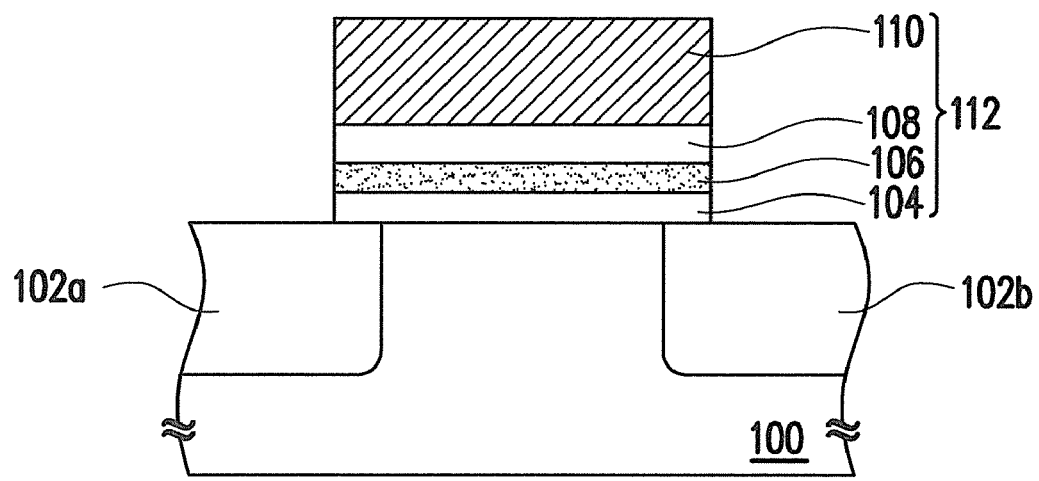
FIG. 1 is a schematic cross-sectional view of a conventional non-volatile memory.
Figure 2:
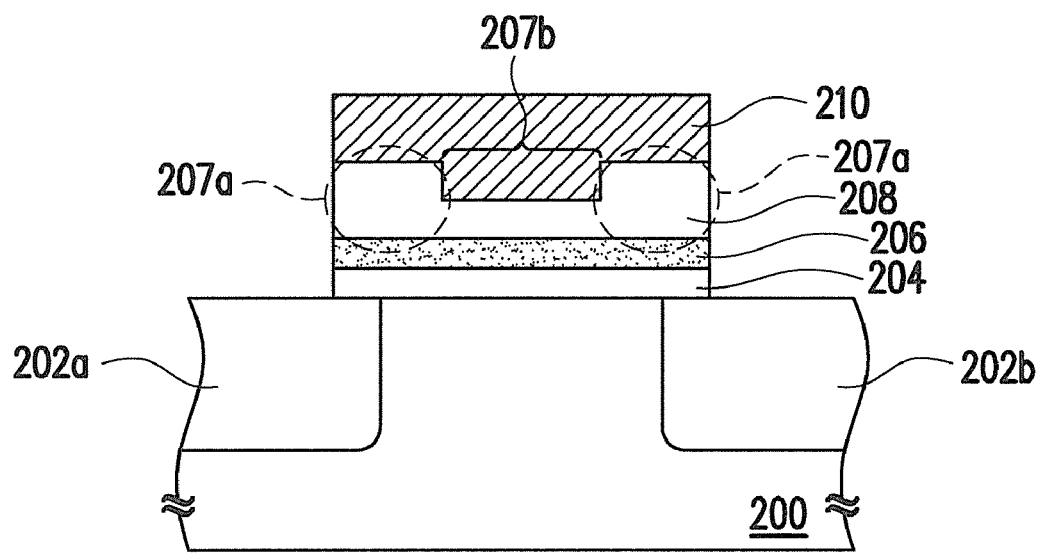
FIG. 2 is a schematic cross-sectional view of a non-volatile memory according to an embodiment of the present invention.

FIG. 2 is a schematic cross-sectional view of a non-volatile memory according to an embodiment of the present invention.

Referring to FIG. 2, the non-volatile memory includes a substrate 200, source/drain regions 202a and 202b, an insulating layer 204, a charge storage layer 206, another insulating layer 208, and a conductive layer 210. The substrate 200 is, for example, a silicon substrate or any other appropriate semiconductor substrates. The source/drain regions 202a and 202b are respectively disposed in the substrate 200 apart from each other.

The insulating layer 204 of the non-volatile memory is disposed on the substrate 200 between the source/drain regions 202a and 202b. The insulating layer 204 is a oxide layer which a material of that is, for example, silicon oxide, and a thickness of the insulating layer 204, for example, ranges from 50 angstrom to 60 angstrom, and is preferably about 54 angstrom. The charge storage layer 206 is disposed on the insulating layer 204. Here, the charge storage layer 206 is a dielectric material provides charge trapping ability, and the dielectric material is nitride material which is silicon nitride, for example. A thickness of the charge storage layer 206, for example, ranges from 60 angstrom to 80 angstrom, and is preferably about 70 angstrom. The insulating layer 208 is disposed on the charge storage layer 206, and the insulating layer 208 is a oxide layer which a material of that is silicon oxide, for example. The conductive layer 210 is disposed on the insulating layer 208, and a material of the conductive layer 210 is polysilicon, for example. Here, the conductive layer 210 serves as a gate of the non-volatile memory.

Note that the difference between the non-volatile memory proposed in the present embodiment and the conventional non-volatile memory lies in that the insulating layer 208 of the non-volatile memory in the present embodiment is not in a uniform thickness. The thickness of the peripheral region (regions 207a surrounded by dotted lines in FIG. 2) of the insulating layer 208 is greater than the thickness of the internal region (a region labeled as 207b in FIG. 2) of the insulating layer 208. Here, the thickness of the internal region 207b of the insulating layer 208, for example, ranges from 80 angstrom to 100 angstrom, and is preferably about 90 angstrom. By contrast, the thickness of the peripheral region 207a of the insulating layer 208 ranges from 90 angstrom to 120 angstrom, for example.

It should be noted that since the non-uniform insulating layer 208 has the greater thickness of the peripheral region 207a than at the internal region 207b, a Vt of the non-volatile memory is affected by the thickness of the insulating layer 208 above the charge storage layer 206, resulting in a relatively significant DIBL. Thereby, the second-bit effect is reduced, and a Vt window is increased as well.

The non-volatile memory depicted in FIG. 2 is taken to elaborate a programming operation of the non-volatile memory of the present invention, an erasing operation thereof, and a reading operation thereof.

Figure 3A:
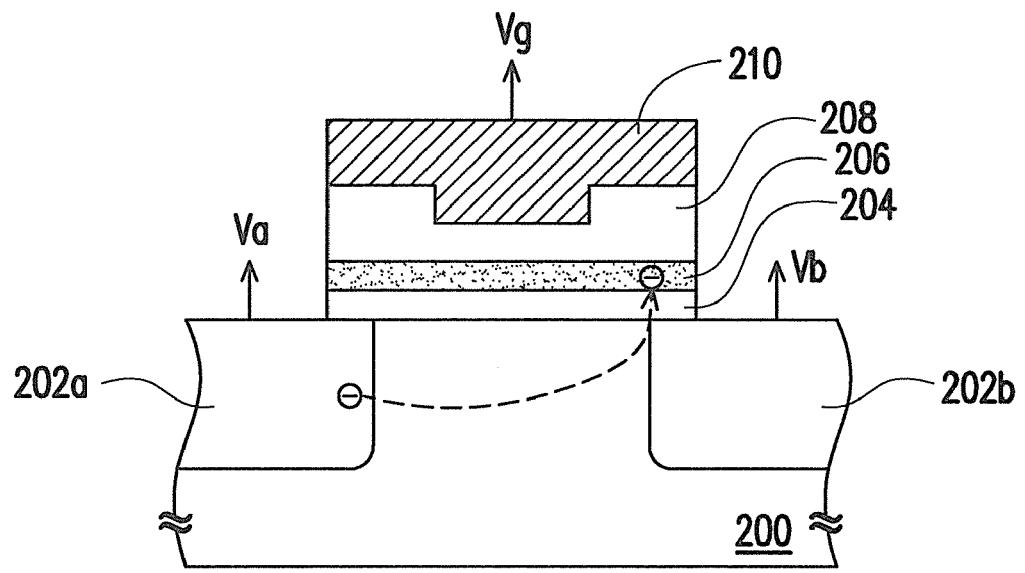
FIGS. 3A and 3B are schematic views illustrating a programming operation of a right bit and a left bit of a memory cell of the non-volatile memory according to the present invention.
Figure 3B:
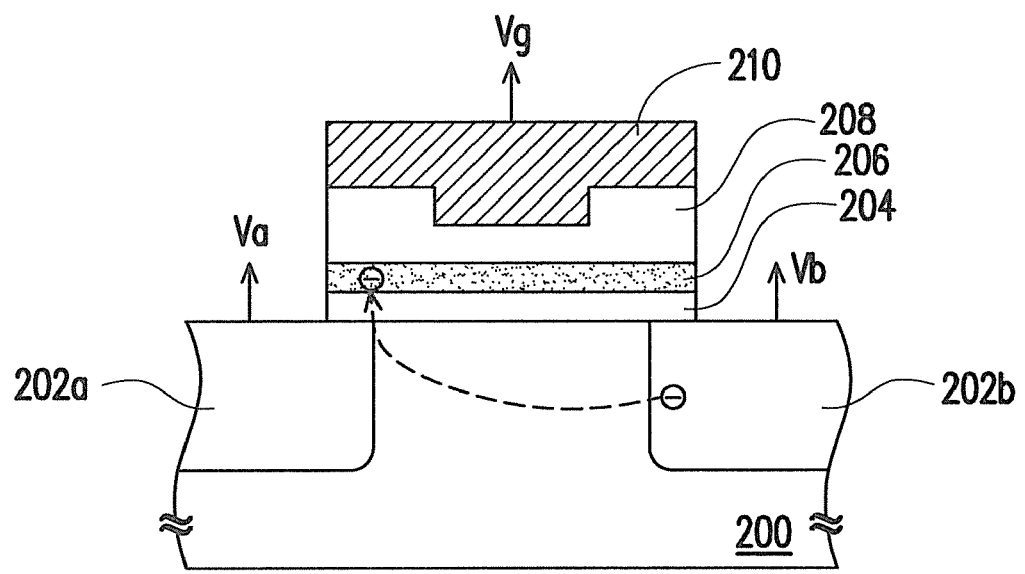

Please refer to FIGS. 3A and 3B which are schematic views illustrating the programming operation of a right bit and a left bit of a memory cell of the non-volatile memory according to the present invention. As shown in FIG. 3A, when the programming operation of the right bit is performed, a voltage Vg is applied to the conductive layer 210, a voltage Va is applied to the source/drain region 202a, and a voltage Vb is applied to the source/drain region 202b. Here, the voltage Vg ranges from 5 V to 10 V, the voltage Va is 0 V, and the voltage Vb ranges from 4 V to 6 V, for example. Said programming operation is performed by injecting channel hot electrons (CHEs). In addition, as indicated in FIG. 3B, when the programming operation of the left bit is performed, the voltage Vg is applied to the conductive layer 210, the voltage Va is applied to the source/drain region 202a, and the voltage Vb is applied to the source/drain region 202b. Here, the voltage Vg ranges from 5 V to 10 V, the voltage Va ranges from 4 V to 6 V, and the voltage Vb is 0 V, for example. Said programming operation is performed by injecting the CHEs as well.

Figure 4A:
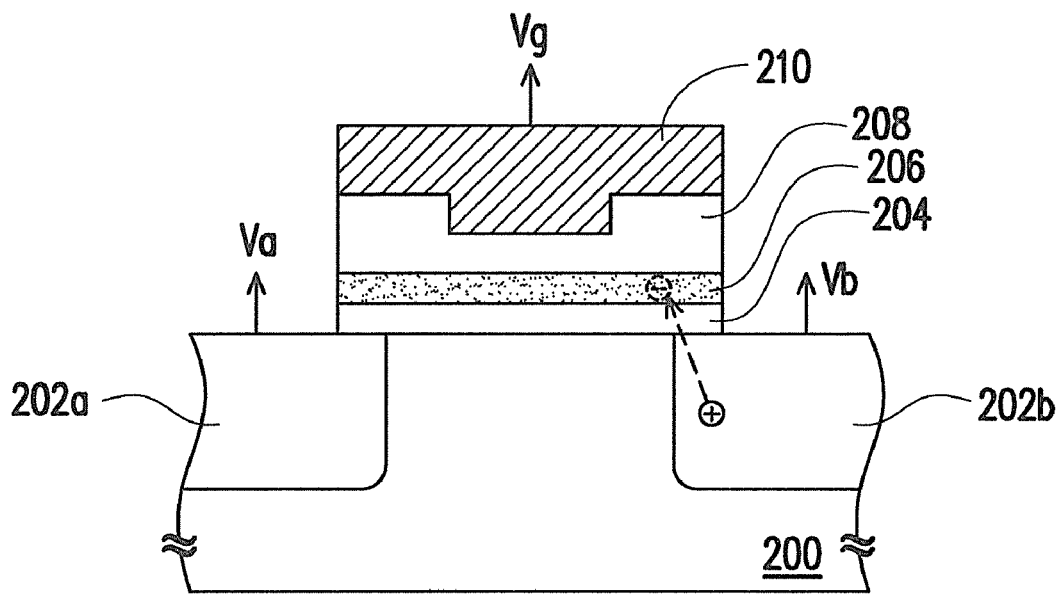
FIGS. 4A and 4B are schematic views illustrating an erasing operation of the right bit and the left bit of the memory cell of the non-volatile memory according to the present invention.
Figure 4B:
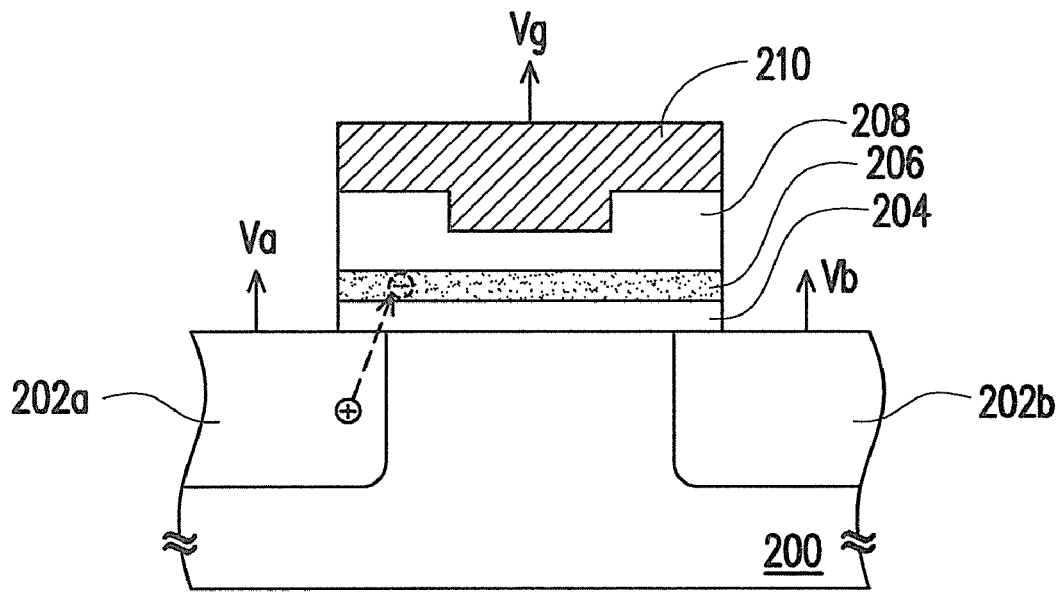

Please refer to FIGS. 4A and 4B which are schematic views illustrating the erasing operation of the right bit and the left bit of the memory cell of the non-volatile memory according to the present invention. As shown in FIG. 4A, when the erasing operation of the right bit is performed, the voltage Vg is applied to the conductive layer 210, the voltage Va is applied to the source/drain region 202a, and the voltage Vb is applied to the source/drain region 202b. Here, the voltage Vg ranges from −10 V to −5 V, the voltage Va is 0 V, and the voltage Vb ranges from 4 V to 6 V, for example. Said erasing operation is performed through a band to band hot hole (BTBHH) effect. In addition, as indicated in FIG. 4B, when the erasing operation of the left bit is performed, the voltage Vg is applied to the conductive layer 210, the voltage Va is applied to the source/drain region 202a, and the voltage Vb is applied to the source/drain region 202b. Here, the voltage Vg ranges from −10 V to −5 V, the voltage Va ranges from 4 V to 6 V, and the voltage Vb is 0 V, for example. Said erasing operation is performed through the BTBHH effect as well.

Figure 5A:
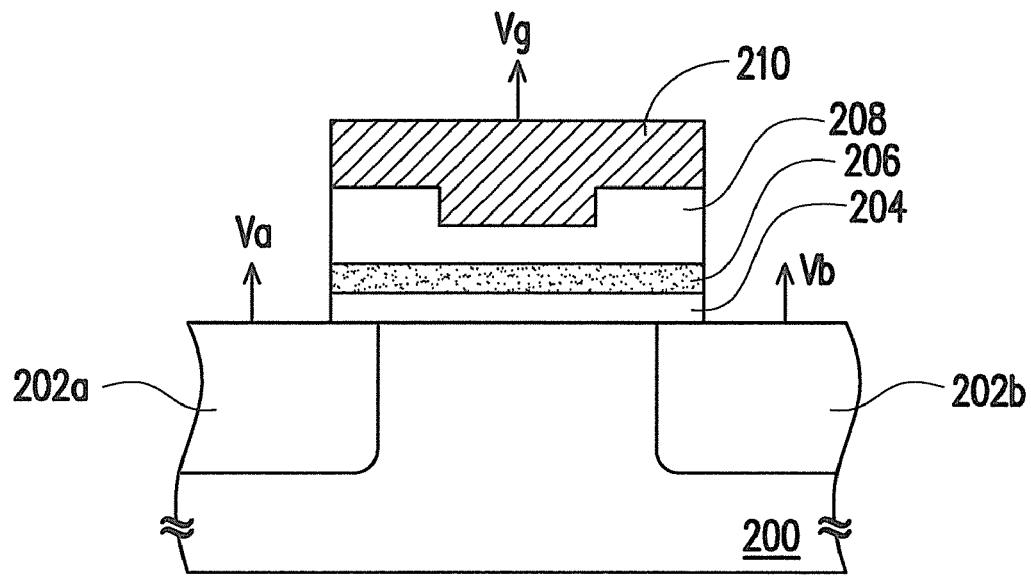
FIGS. 5A and 5B are schematic views illustrating a reading operation of the right bit and the left bit of the memory cell of the non-volatile memory according to the present invention.
Figure 5B:
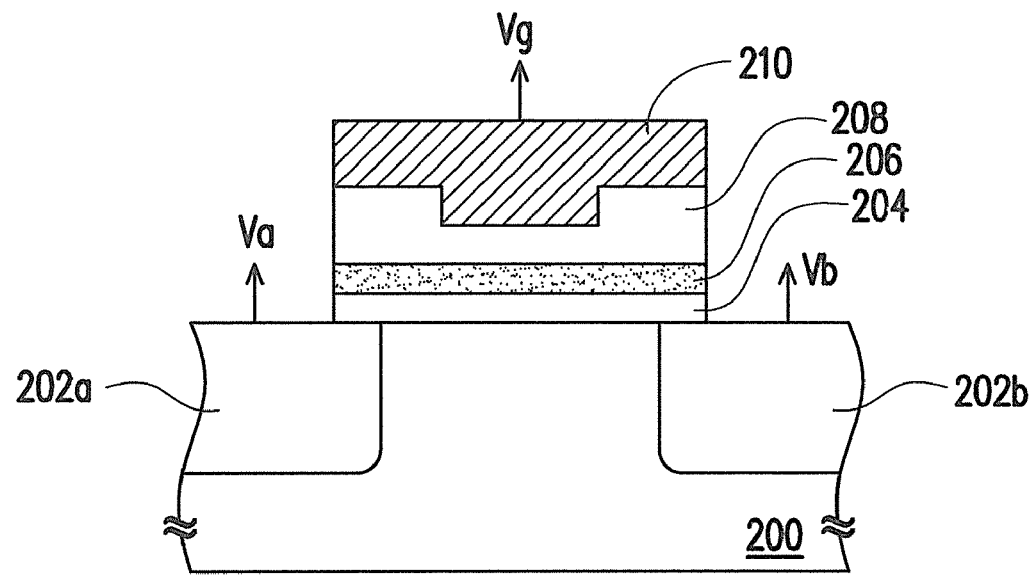

Please refer to FIGS. 5A and 5B which are schematic views illustrating the reading operation of the right bit and the left bit of the memory cell of the non-volatile memory according to the present invention. As shown in FIG. 5A, when the reading operation of the right bit is performed, the voltage Vg is applied to the conductive layer 210, the voltage Va is applied to the source/drain region 202a, and the voltage Vb is applied to the source/drain region 202b. Here, the voltage Vg ranges from 3 V to 5 V, the voltage Va ranges from 1 V to 1.8 V, and the voltage Vb is 0 V, for example. In addition, as indicated in FIG. 5B, when the reading operation of the left bit is performed, the voltage Vg is applied to the conductive layer 210, the voltage Va is applied to the source/drain region 202a, and the voltage Vb is applied to the source/drain region 202b. Here, the voltage Vg ranges from 3 V to 5 V, the voltage Vb ranges from 1 V to 1.8 V, and the voltage Va is 0 V, for example.

Next, several embodiments are enumerated hereinafter for elaborating methods for fabricating the non-volatile memory of the present invention.

First Embodiment

FIGS. 6A through 6F are cross-sectional views illustrating a process of fabricating the non-volatile memory according to a first embodiment of the present invention.

Figure 6A:
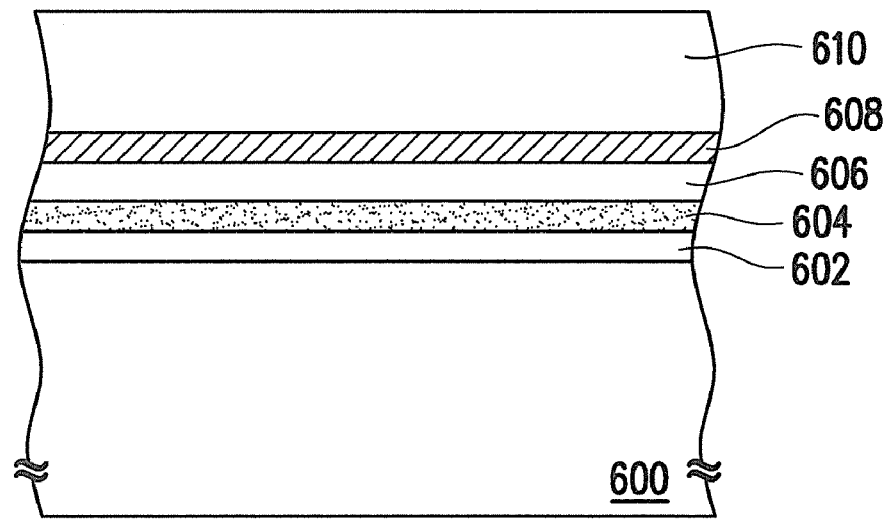
FIGS. 6A through 6F are cross-sectional views illustrating a process of fabricating the non-volatile memory according to a first embodiment of the present invention.

First, as shown in FIG. 6A, a substrate 600 is provided. The substrate 600 is, for example, a silicon substrate or any other appropriate semiconductor substrates. Next, an insulating layer 602 is formed on the substrate 600. The insulating layer 602 is a oxide layer which a material of that is, for example, silicon oxide, and the insulating layer 602 is formed by performing a chemical vapor deposition (CVD) process, for example. A thickness of the insulating layer 602, for example, ranges from 50 angstrom to 60 angstrom, and is preferably about 54 angstrom. Next, a charge storage layer 604 is formed on the insulating layer 602. The charge storage layer 604 is a dielectric material provides charge trapping ability, and the dielectric material is nitride material which is silicon nitride, for example. The charge storage layer 604 is formed by performing the CVD process, for example. A thickness of the charge storage layer 604, for example, ranges from 60 angstrom to 80 angstrom, and is preferably about 70 angstrom. Thereafter, another insulating layer 606 is formed on the charge storage layer 604. A material of the insulating layer 606 is, for example, silicon oxide, and the insulating layer 606 is formed by performing the CVD process, for example. A thickness of the insulating layer 606, for example, ranges from 80 angstrom to 100 angstrom, and is preferably about 90 angstrom.

Thereafter, referring to FIG. 6A, a consuming layer 608 is formed on the insulating layer 606 by performing the CVD process, for example. The consuming layer 608 is a polysilicon layer, for example. After that, a mask layer 610 is formed on the consuming layer 608. A material of the mask layer 610 is, for example, silicon nitride, and a method for forming the mask layer 610 includes carrying out the CVD process, for example.

Figure 6B:
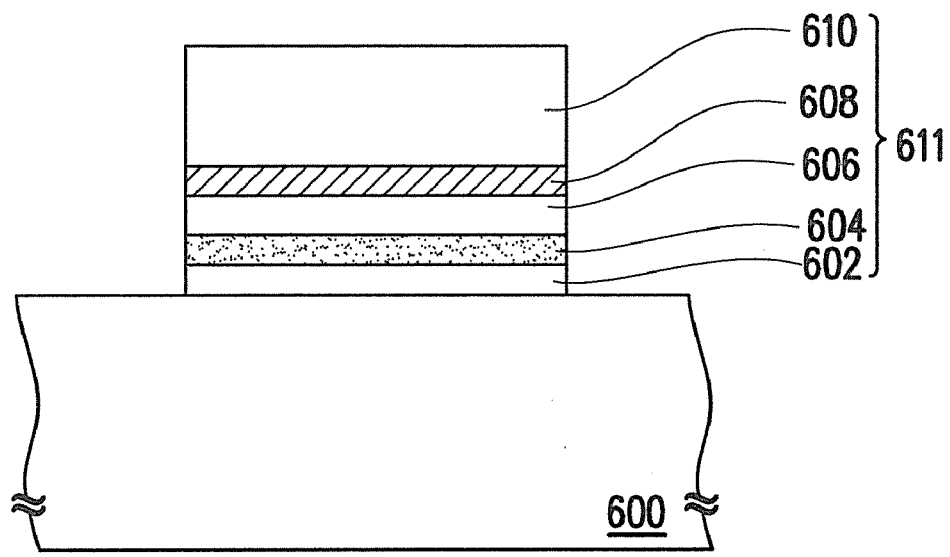

Next, referring to FIG. 6B, a patterning process is performed on the mask layer 610, the consuming layer 608, the insulating layer 606, the dielectric layer 604, and the insulating layer 602, so as to form a stacked structure 611.

Figure 6C:
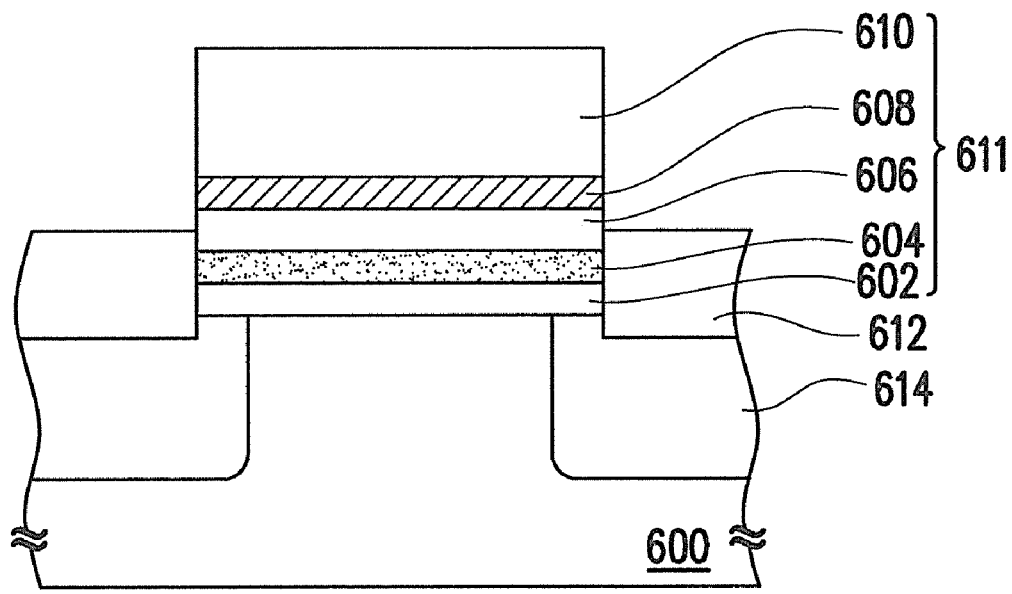

Afterwards, referring to FIG. 6C, an isolation layer 612 is formed on the substrate 600 at the sides of the stacked structure 611. Here, a material of the isolation layer 612 is silicon oxide, for example. Thereafter, two source/drain regions 614 are formed in the substrate 600 below the isolation layer 612. The source/drain regions 614 are formed by performing an ion implantation process, for example.

Figure 6D:
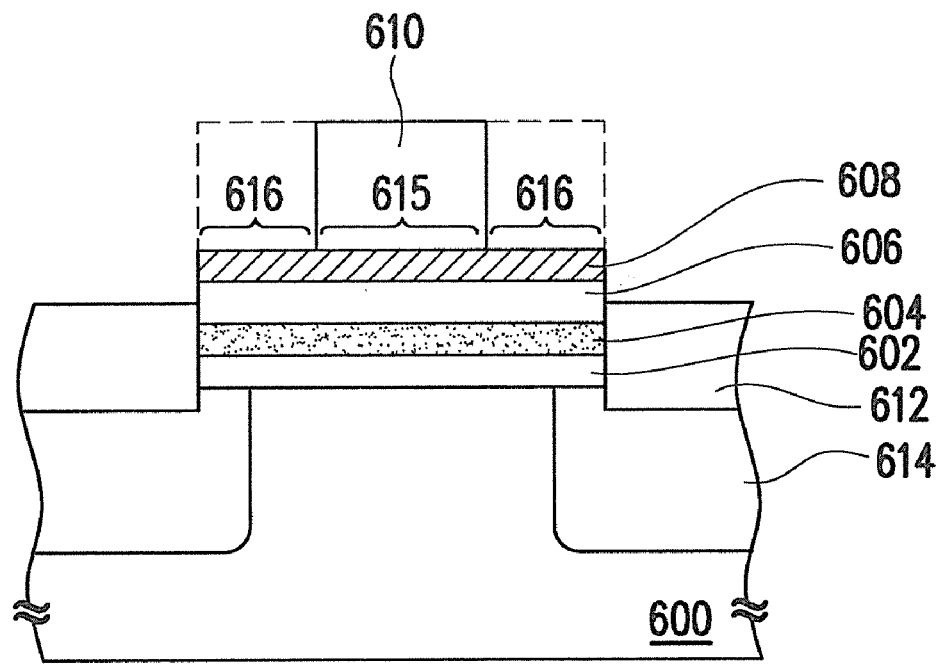

Next, referring to FIG. 6D, a portion of the mask layer 610 is removed, so as to cover an internal region 615 of the consuming layer 608 and expose surfaces of a peripheral region 616 of the consuming layer 608. The portion of the mask layer 610 is removed by performing an etching process, for example.

Figure 6E:
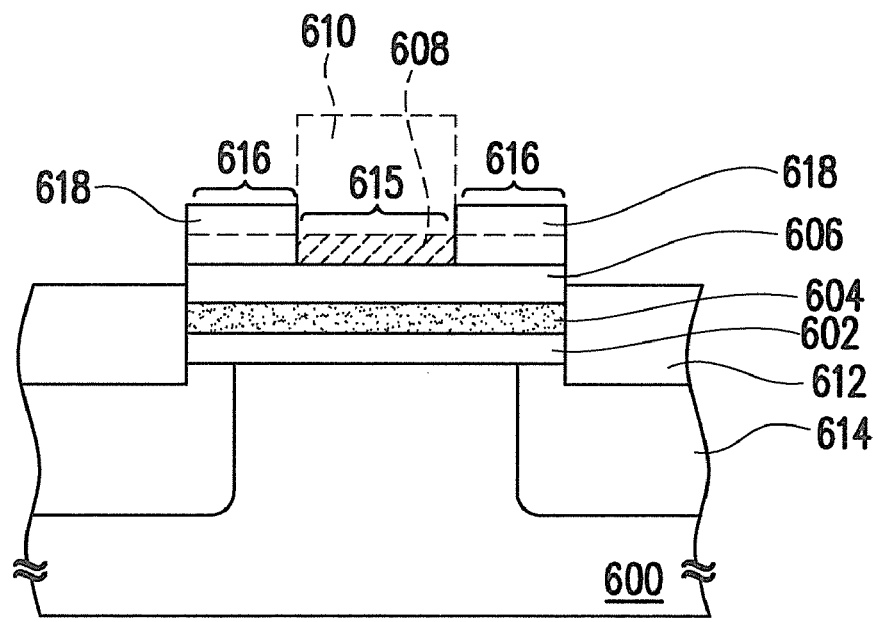

After that, referring to FIG. 6E, a converting process which is, for example, an oxidation process is carried out, such that the consuming layer 608 of the peripheral region 616 is oxidized, and an insulating layer 618 is then formed. A thickness of the insulating layer 618 ranges from 10 angstrom to 20 angstrom, for example. Here, the insulating layers 606 and 618 serve as an upper insulating layer above the dielectric layer 604. After the formation of the insulating layer 618, one etching process is then carried out to remove the mask layer 610 and the polysilicon layer 608 disposed below the mask layer 610.

Figure 6F:
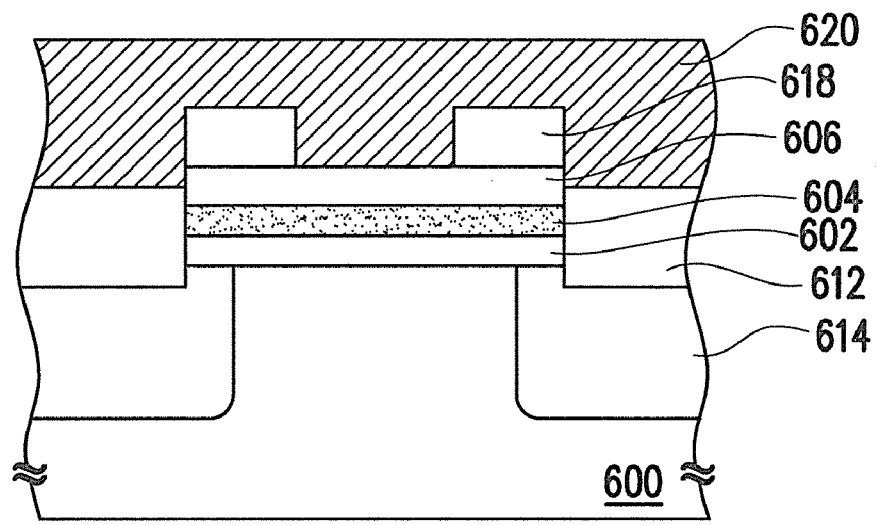

Thereafter, referring to FIG. 6F, a conductive layer 620 is formed on the insulating layers 606 and 618. A material of the conductive layer 620 is polysilicon, for example, and the conductive layer 620 is fondled by performing the CVD process, for example. The fabrication of the non-volatile memory is then completed.

Second Embodiment

FIGS. 7A through 7G are cross-sectional views illustrating a process of fabricating the non-volatile memory according to a second embodiment of the present invention.

Figure 7A:
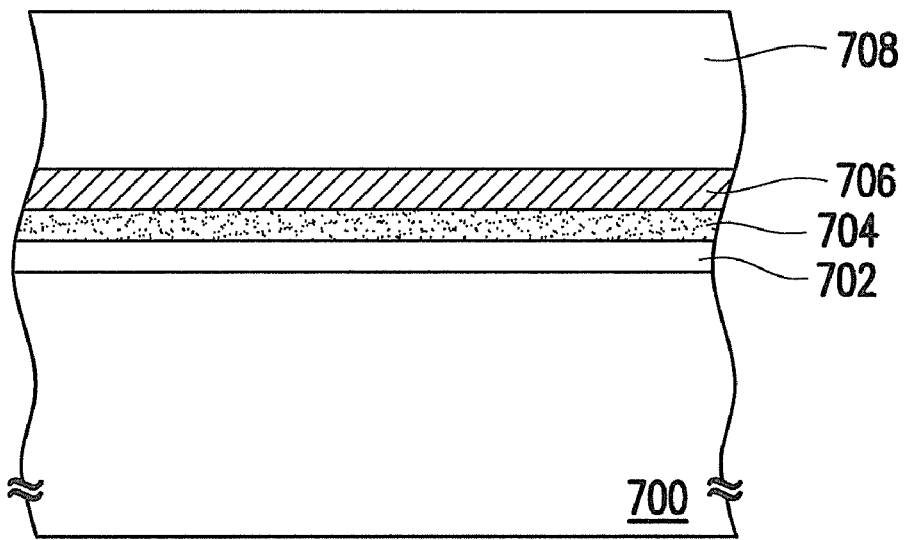
FIGS. 7A through 7G are cross-sectional views illustrating a process of fabricating the non-volatile memory according to a second embodiment of the present invention.

First, as shown in FIG. 7A, a substrate 700 is provided. The substrate 700 is, for example, a silicon substrate or any other appropriate semiconductor substrates. Next, an insulating layer 702 is formed on the substrate 700. The insulating layer 702 is a oxide layer which a material of that is, for example, silicon oxide, and the insulating layer 702 is formed by performing the CVD process, for example. A thickness of the insulating layer 702, for example, ranges from 50 angstrom to 60 angstrom, and is preferably about 54 angstrom.

Thereafter, referring to FIG. 7A, a charge storage layer 704 is formed on the insulating layer 702. The charge storage layer 704 is a dielectric material provides charge trapping ability, and the dielectric material is nitride material which is silicon nitride, for example. The charge storage layer 704 is formed by performing the CVD process, for example. A thickness of the charge storage layer 704, for example, ranges from 60 angstrom to 80 angstrom, and is preferably about 70 angstrom. Afterwards, a consuming layer 706 is formed on the charge storage layer 704 by performing the CVD process, for example. The consuming layer is a polysilicon layer, for example. After that, a mask layer 708 is formed on the consuming layer 706. A material of the mask layer 708 is, for example, silicon nitride, and a method for forming the mask layer 708 includes carrying out the CVD process, for example.

Figure 7B:
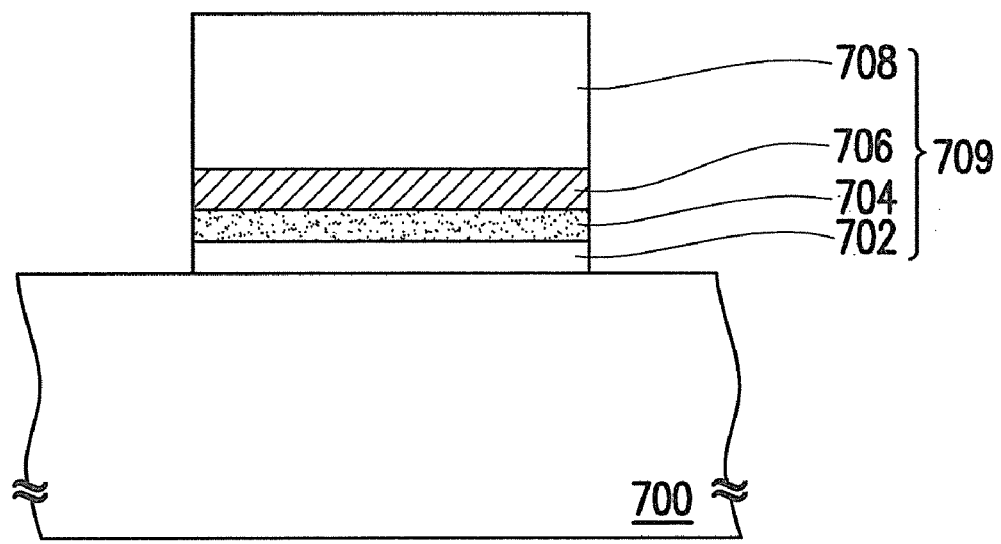

Next, referring to FIG. 7B, the patterning process is performed on the mask layer 708, the consuming layer 706, the charge storage layer 704, and the insulating layer 702, so as to form a stacked structure 709.

Figure 7C:
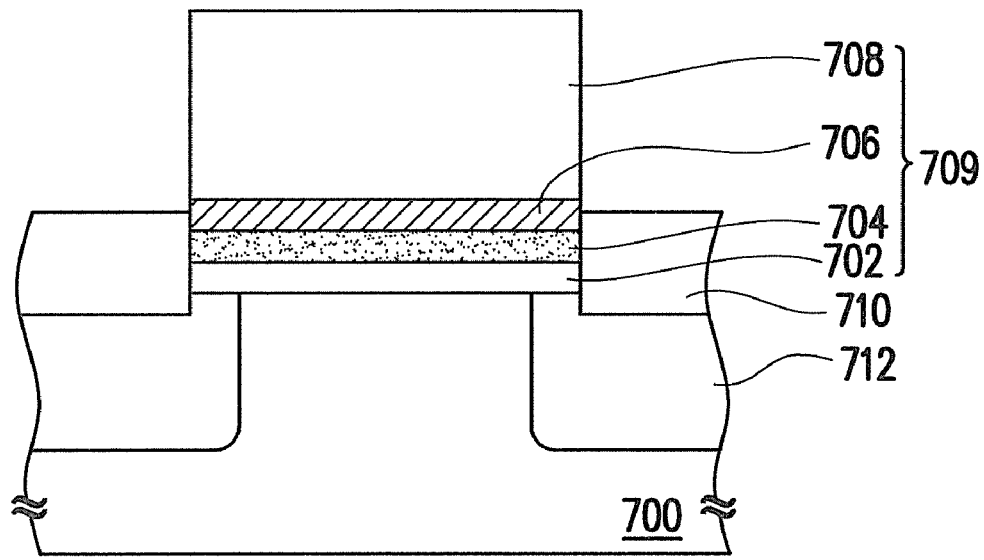

Afterwards, referring to FIG. 7C, an isolation layer 710 is formed on the substrate 700 at the sides of the stacked structure 709. Here, a material of the isolation layer 710 is silicon oxide, for example. Thereafter, two source/drain regions 712 are formed in the substrate 700 below the isolation layer 710. The source/drain regions 712 are formed by performing the ion implantation process, for example.

Figure 7D:
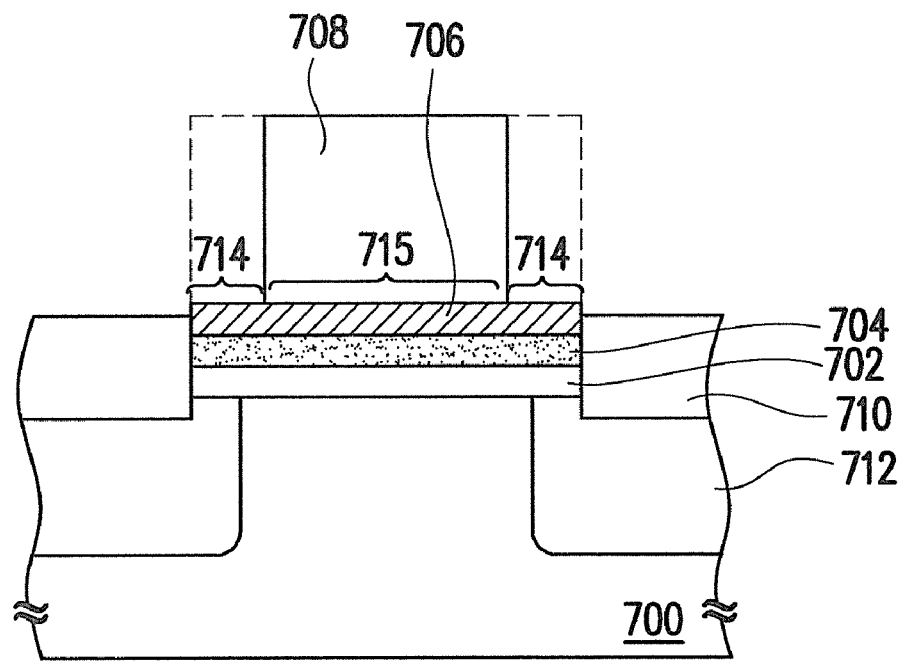

Next, referring to FIG. 7D, a portion of the mask layer 708 is removed, so as to cover an internal region 715 of the consuming layer 706 and expose surfaces of a peripheral region 714 of the consuming layer 706. The portion of the mask layer 708 is removed by performing the etching process, for example.

Figure 7E:
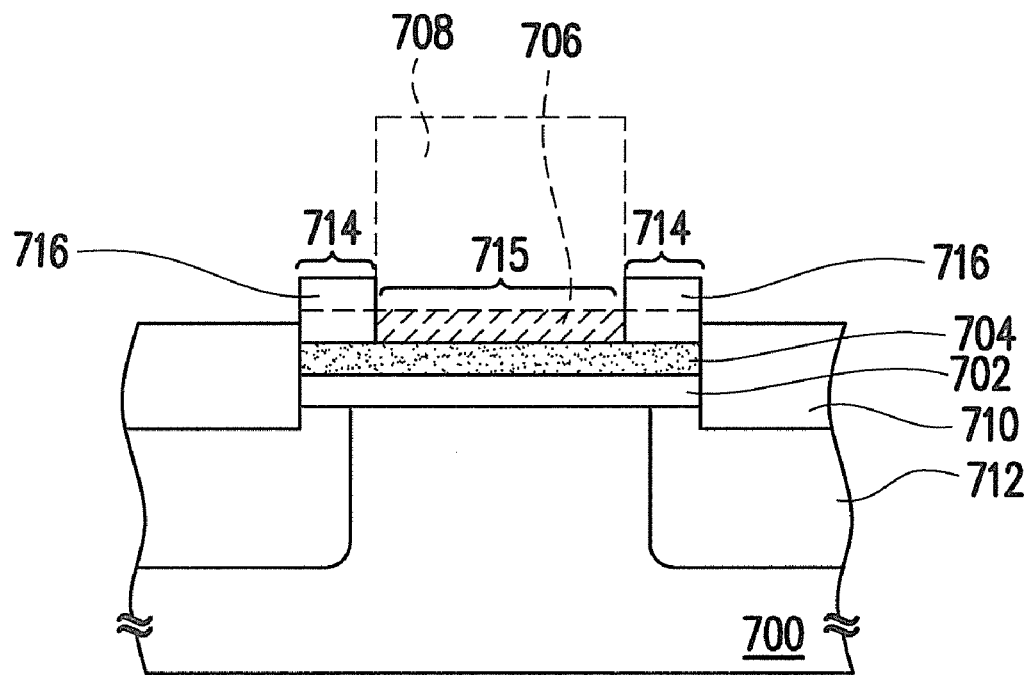

After that, referring to FIG. 7E, a converting process which is, for example, an oxidation process is carried out, such that the consuming layer 706 of the peripheral region 714 is oxidized, and an insulating layer 716 is then formed. A thickness of the insulating layer 716 ranges from 10 angstrom to 20 angstrom, for example. Next, the etching process is performed to remove the mask layer 708 and the consuming layer 706 disposed below the mask layer 708.

Figure 7F:
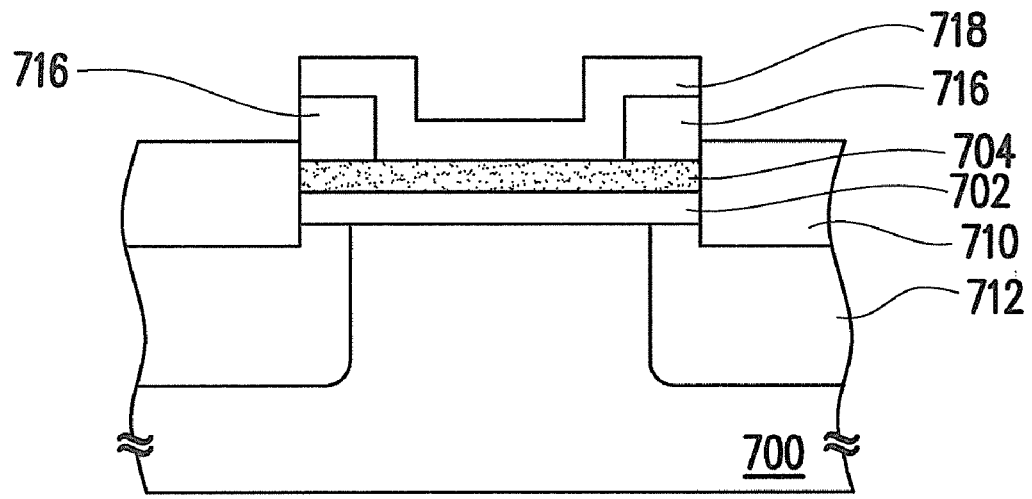

Thereafter, referring to FIG. 7F, another insulating layer 718 is conformally rimmed above the insulating layer 716 and the charge storage layer 704. The insulating layer 718 is a oxide layer which a material of that is, for example, silicon oxide, and the insulating layer 718 is formed by performing the CVD process, for example. A thickness of the insulating layer 718, for example, ranges from 80 angstrom to 100 angstrom, and is preferably about 90 angstrom. Here, the insulating layers 716 and 718 serve as the upper insulating layer above the charge storage layer 704.

Figure 7G:
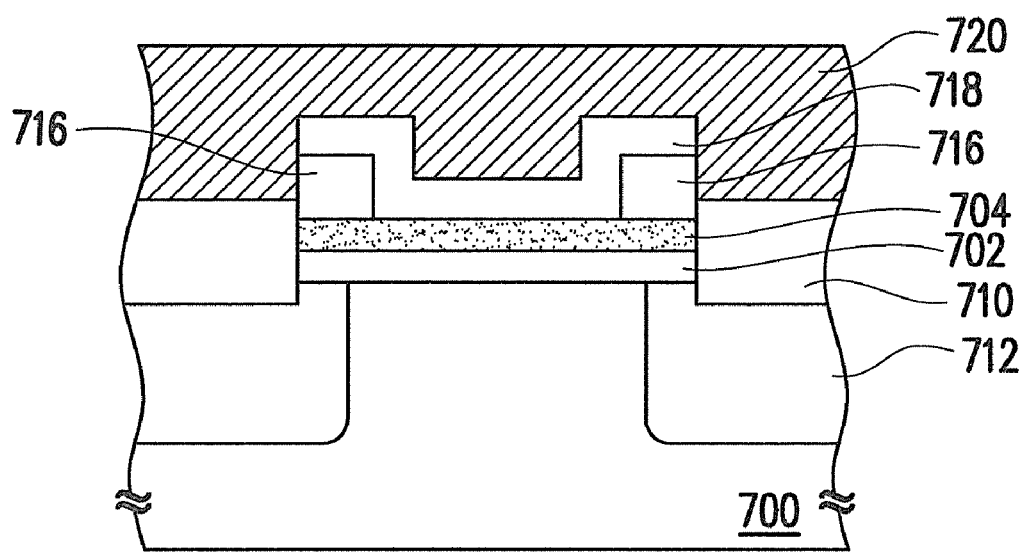

After that, referring to FIG. 7G, a conductive layer 720 is framed on the insulating layer 718. A material of the conductive layer 720 is polysilicon, for example, and the conductive layer 720 is formed by performing the CVD process, for example. The fabrication of the non-volatile memory is then completed.

Third Embodiment

FIGS. 8A through 8G are cross-sectional views illustrating a process of fabricating the non-volatile memory according to a third embodiment of the present invention.

Figure 8A:
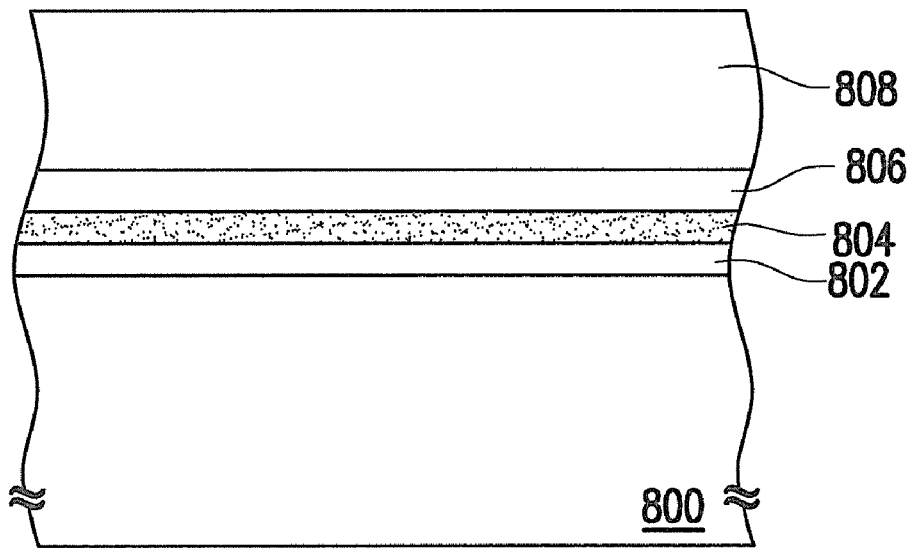
FIGS. 8A through 8G are cross-sectional views illustrating a process of fabricating the non-volatile memory according to a third embodiment of the present invention.

First, as shown in FIG. 8A, a substrate 800 is provided. The substrate 800 is, for example, a silicon substrate or any other appropriate semiconductor substrates. Next, an insulating layer 802 is formed on the substrate 800. The insulating layer 802 is a oxide layer which a material of that is, for example, silicon oxide, and the insulating layer 802 is formed by performing the CVD process, for example. A thickness of the insulating layer 802, for example, ranges from 50 angstrom to 60 angstrom, and is preferably about 54 angstrom.

Thereafter, referring to FIG. 8A, a charge storage layer 804 is formed on the insulating layer 802. The charge storage layer 804 is a dielectric material provides charge trapping ability, and the dielectric material is nitride material which is silicon nitride, for example. The charge storage layer 804 is formed by performing the CVD process, for example. A thickness of the charge storage layer 804, for example, ranges from 60 angstrom to 80 angstrom, and is preferably about 70 angstrom. Thereafter, another insulating layer 806 is formed on the charge storage layer 804. The insulating layer 806 is a oxide layer which a material of that is, for example, silicon oxide, and the insulating layer 806 is formed by performing the CVD process, for example. A thickness of the insulating layer 806, for example, ranges from 80 angstrom to 100 angstrom, and is preferably about 90 angstrom. After that, a mask layer 808 is formed on the insulating layer 806. A material of the mask layer 808 is, for example, silicon nitride, and a method for forming the mask layer 808 includes carrying out the CVD process, for example.

Figure 8B:
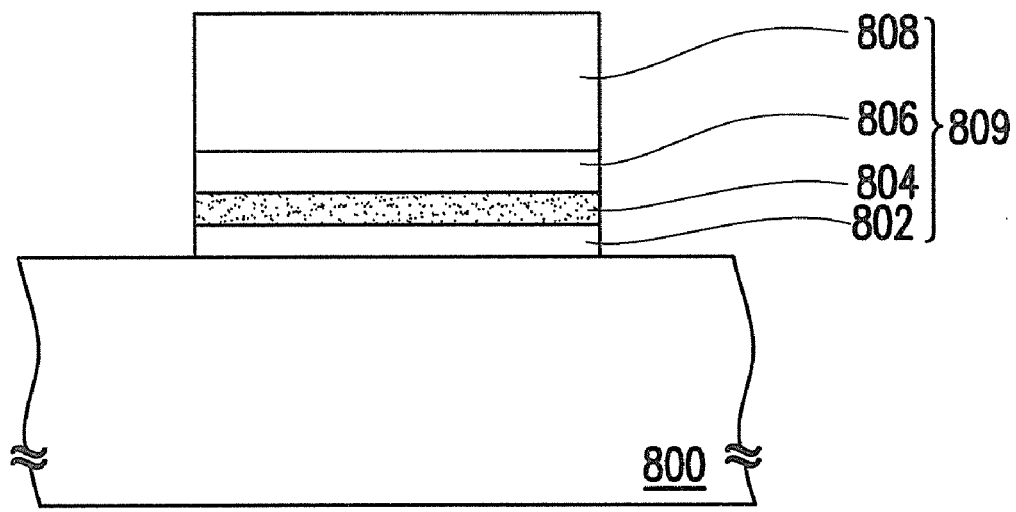

Next, referring to FIG. 8B, the patterning process is performed on the mask layer 808, the insulating layer 806, the charge storage layer 804, and the insulating layer 602, so as to form a stacked structure 809.

Figure 8C:
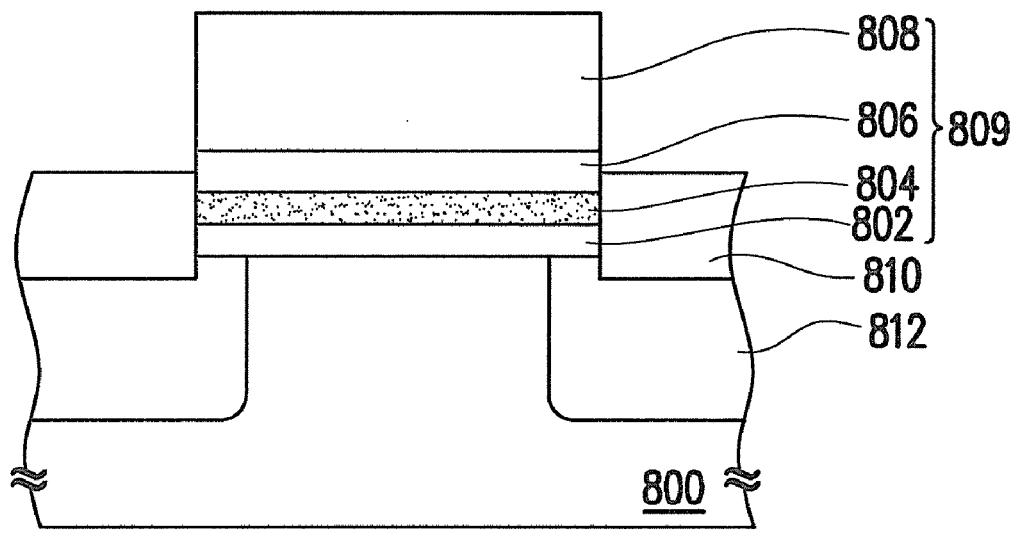

Afterwards, referring to FIG. 8C, an isolation layer 810 is formed on the substrate 800 at the sides of the stacked structure 809. Here, a material of the isolation layer 810 is silicon oxide, for example. Thereafter, two source/drain regions 812 are formed in the substrate 800 below the isolation layer 810. The source/drain regions 812 are formed by performing the ion implantation process, for example.

Figure 8D:
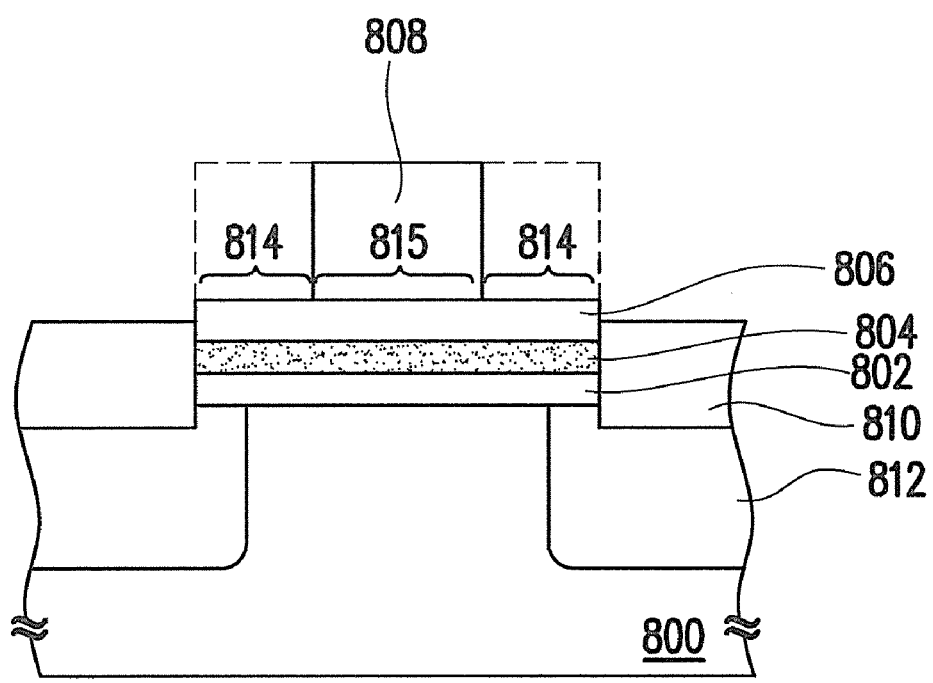

Afterwards, referring to FIG. 8D, a portion of the mask layer 808 is removed, so as to cover a internal region 815 of the second insulating layer 806 and expose surfaces of a peripheral region 814 of the insulating layer 806. The portion of the mask layer 808 are removed by performing the etching process, for example.

Figure 8E:
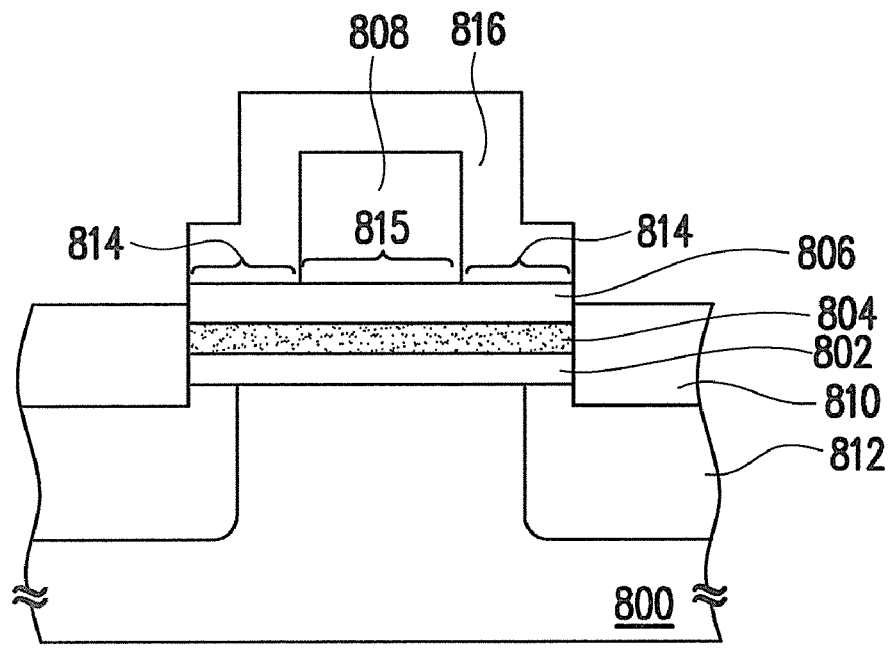

Next, referring to FIG. 8E, another insulating layer 816 is formed above the mask layer 808 and the peripheral region 814 of the insulating layer 806. A material of the insulating layer 816 is, for example, silicon oxide, and the insulating layer 816 is formed by performing the CVD process, for example.

Figure 8F:
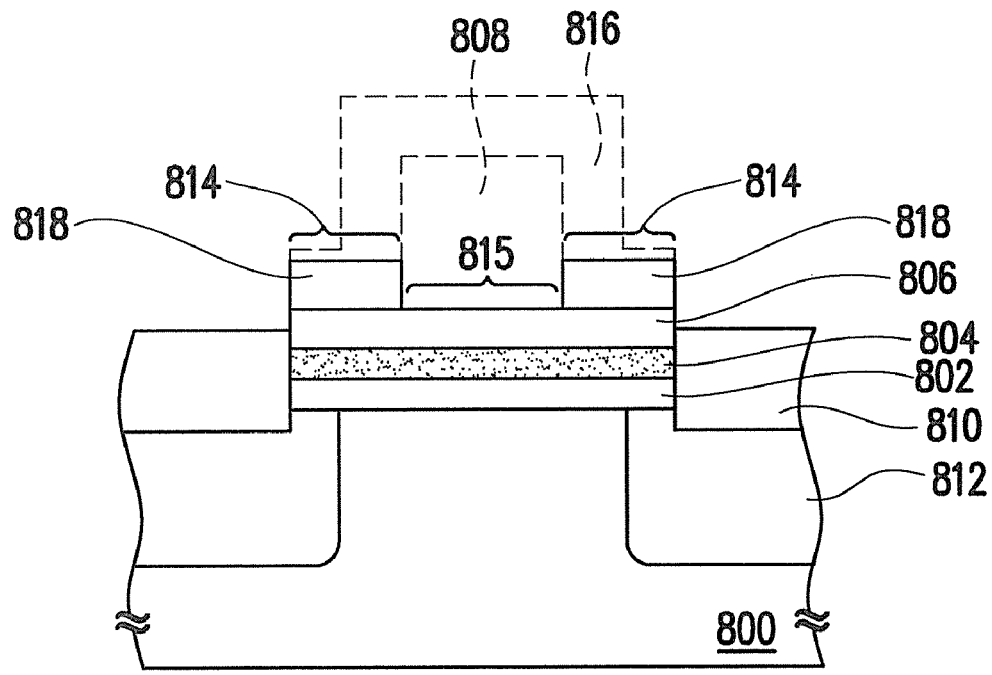

After that, referring to FIG. 8F, a portion of the insulating layer 816 is removed, such that an insulating layer 818 remains. The insulating layer 818 covers the side regions 814 of the insulating layer 806. A thickness of the insulating layer 818 ranges from 10 angstrom to 20 angstrom, for example. Here, the insulating layers 806 and 818 serve as the upper insulating layer above the charge storage layer 804. After the formation of the insulating layer 818, the etching process is performed to remove the mask layer 808.

Figure 8G:
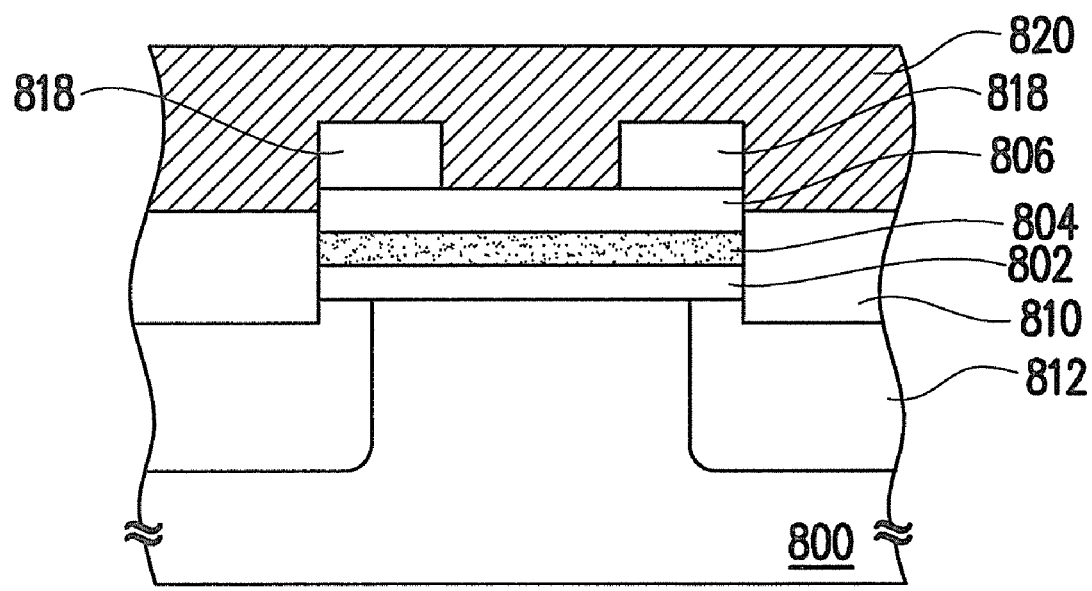

Thereafter, referring to FIG. 8G, a conductive layer 820 is formed on the insulating layers 806 and 818. A material of the conductive layer 820 is polysilicon, for example, and the conductive layer 820 is formed by performing the CVD process, for example. The fabrication of the non-volatile memory is then completed.

Fourth Embodiment

FIGS. 9A through 9G are cross-sectional views illustrating a process of fabricating the non-volatile memory according to a fourth embodiment of the present invention.

Figure 9A:
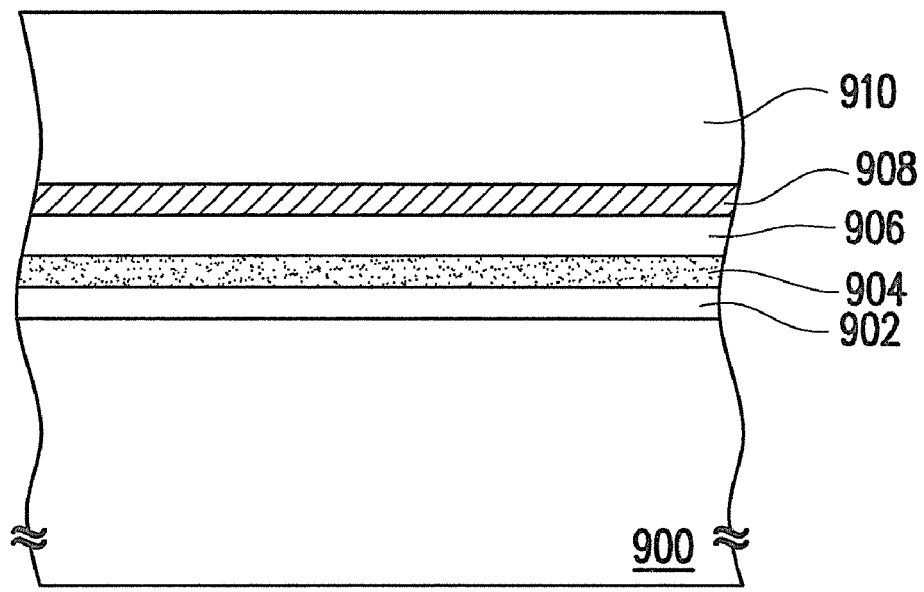
FIGS. 9A through 9G are cross-sectional views illustrating a process of fabricating the non-volatile memory according to a fourth embodiment of the present invention.

First, as shown in FIG. 9A, a substrate 900 is provided. The substrate 900 is, for example, a silicon substrate or any other appropriate semiconductor substrates. Next, an insulating layer 902 is formed on the substrate 900. The insulating layer 902 is a oxide layer which material of that is, for example, silicon oxide, and the insulating layer 902 is formed by performing the CVD process, for example. A thickness of the insulating layer 902, for example, ranges from 50 angstrom to 60 angstrom, and is preferably about 54 angstrom. Next, a charge storage layer 904 is formed on the insulating layer 902. The charge storage layer 904 is a dielectric material provides charge trapping ability, and the dielectric material is nitride material which is silicon nitride, for example. The charge storage layer 904 is formed by performing the CVD process, for example. A thickness of the charge storage layer 904, for example, ranges from 60 angstrom to 80 angstrom, and is preferably about 70 angstrom. Thereafter, another insulating layer 906 is formed on the charge storage layer 904. The insulating layer 906 is a oxide layer which a material of that is, for example, silicon oxide, and the insulating layer 906 is formed by performing the CVD process, for example. A thickness of the insulating layer 906, for example, ranges from 80 angstrom to 100 angstrom, and is preferably about 90 angstrom.

Thereafter, referring to FIG. 9A, a consuming layer 908 is formed on the insulating layer 906 by performing the CVD process, for example. The consuming layer is a polysilicon layer, for example. After that, a mask layer 910 is formed on the consuming layer 908. A material of the mask layer 910 is, for example, silicon nitride, and a method for forming the mask layer 910 includes carrying out the CVD process, for example.

Figure 9B:
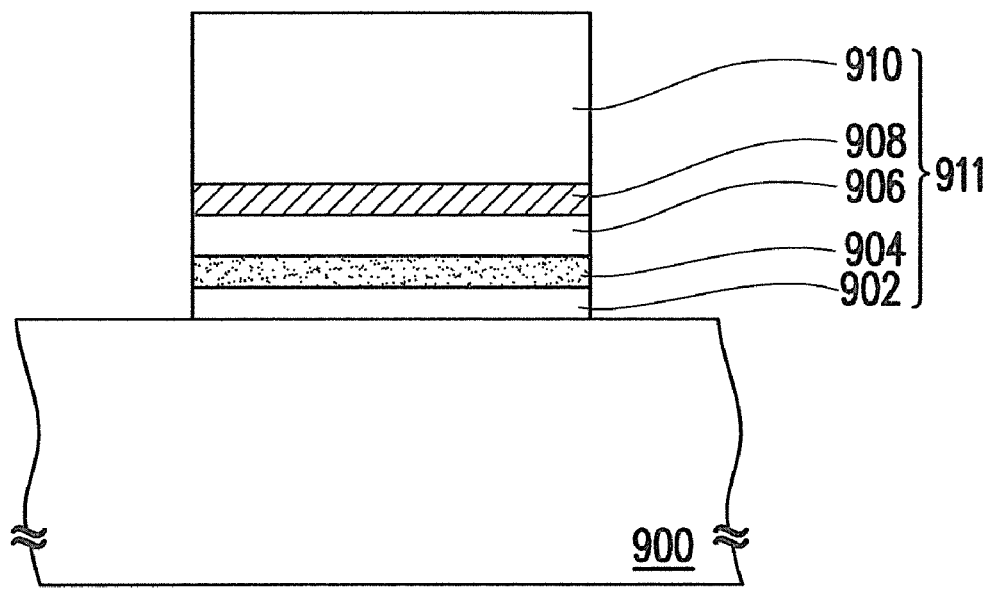

Next, referring to FIG. 9B, the patterning process is performed on the mask layer 910, the consuming layer 908, the insulating layer 906, the charge storage layer 904, and the insulating layer 902, so as to form a stacked structure 911.

Figure 9C:
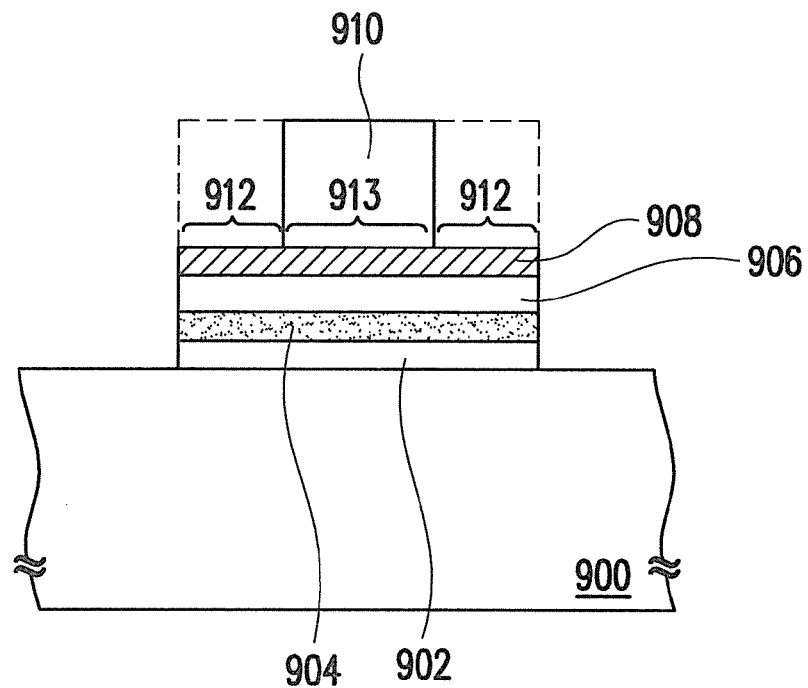

Next, referring to FIG. 9C, a portion of the mask layer 910 is removed, so as to cover a internal region 913 of the consuming layer 908 and expose surfaces of a peripheral region 912 of the consuming layer 908. The portion of the mask layer 910 is removed by performing the etching process, for example.

Figure 9D:
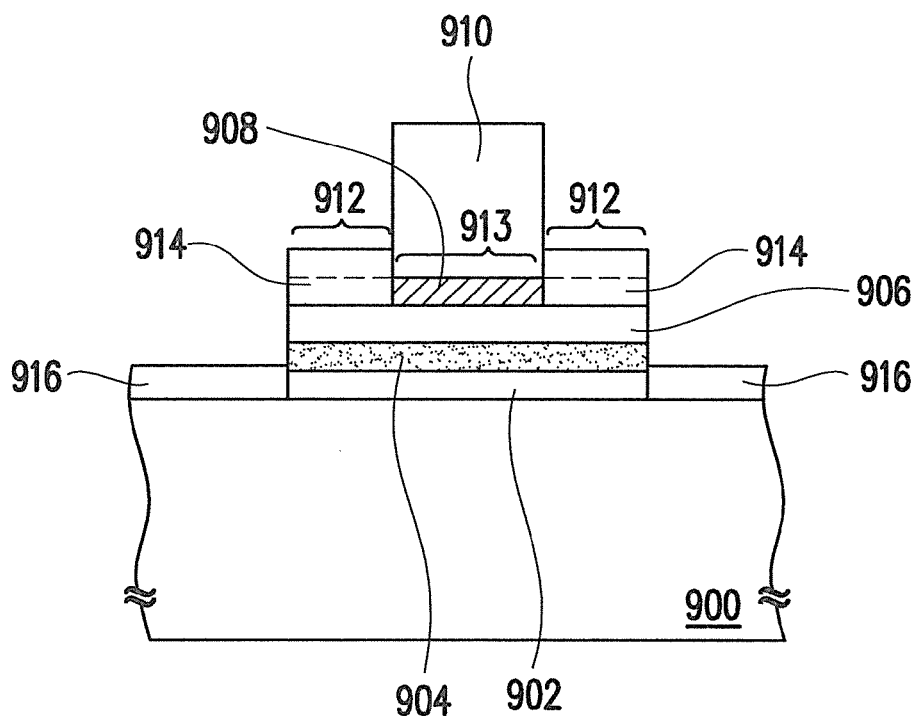

As illustrated in FIG. 9D, the converting process which is, for example, an oxidation process is then performed, such that the consuming layer 908 of the peripheral region 912 is oxidized for forming an insulating layer 914. Another insulating layer 916 is also formed on a surface of the substrate 900 at the sides of the stacked structure 911.

Figure 9E:
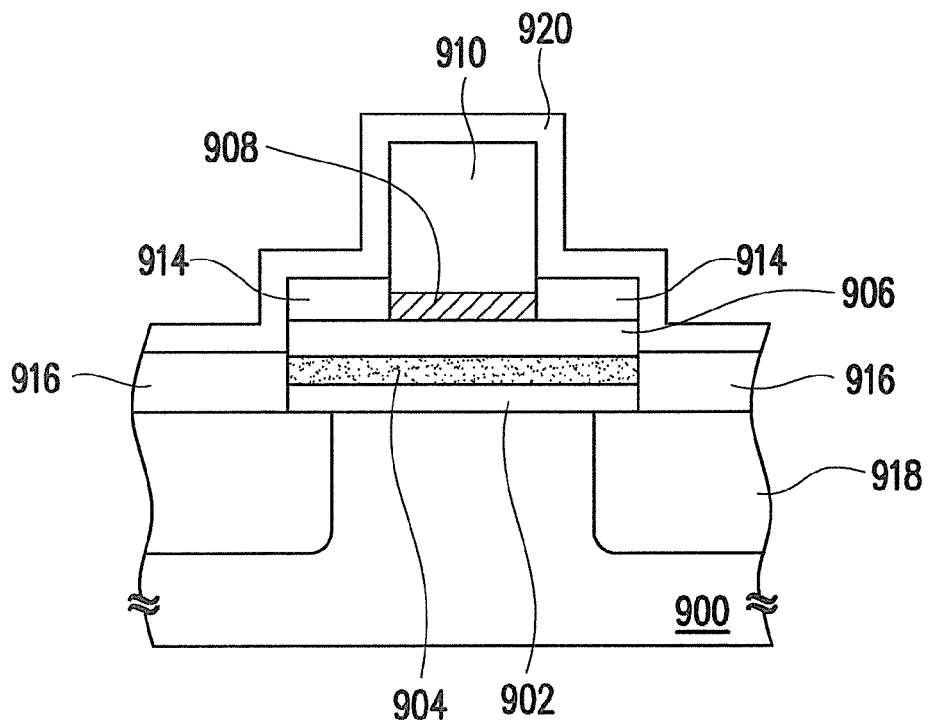

Afterwards, referring to FIG. 9E, two source/drain regions 918 are formed in the substrate 900 below the insulating layer 916. The source/drain regions 918 are formed by performing the ion implantation process, for example. Next, another insulating layer 920 is conformally formed above the mask layer 910, the insulating layer 914, and the insulating layer 916. The insulating layer 920 is a oxide layer which a material of that is, for example, silicon oxide, and the insulating layer 920 is formed by performing the CVD process, for example.

Figure 9F:
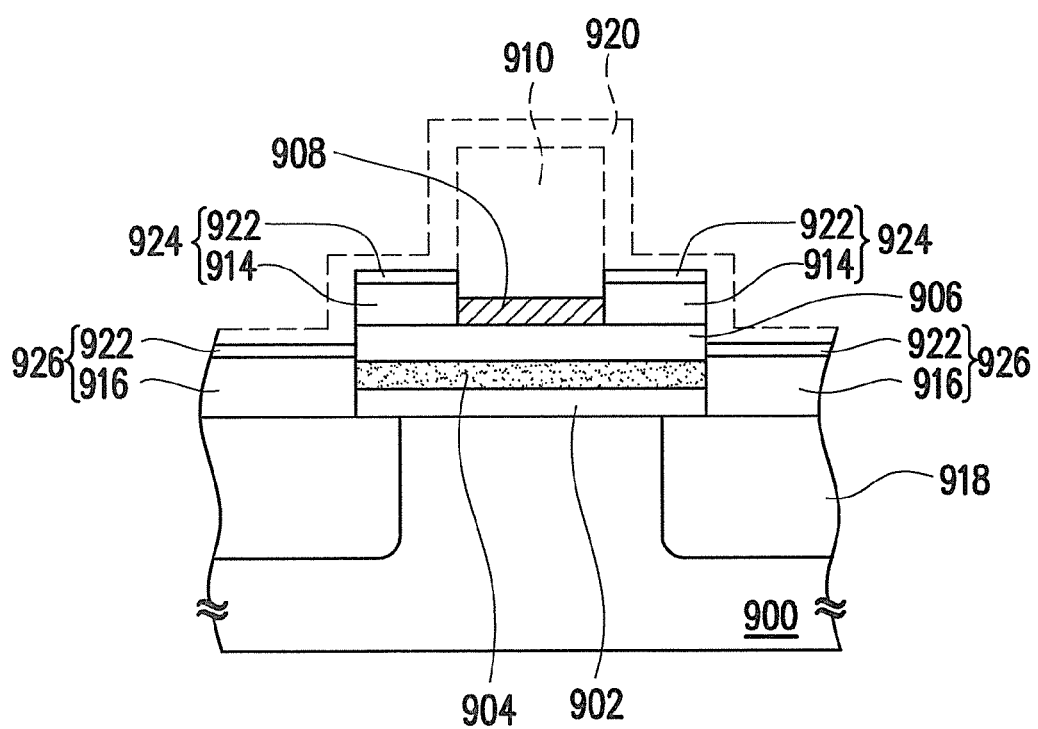

After that, referring to FIG. 9F, a portion of the insulating layer 920 is removed, such that an insulating layer 922 remains. The insulating layer 922 and the insulating layer 914 together construct another insulating layer 924. A thickness of the insulating layer 924 ranges from 10 angstrom to 20 angstrom, for example. Here, the insulating layers 906 and 924 serve as the upper insulating layer above the charge storage layer 904. On the other hand, the insulating layers 922 and 916 together form a so-called isolation layer 926. Next, the mask layer 910 is removed.

Figure 9G:
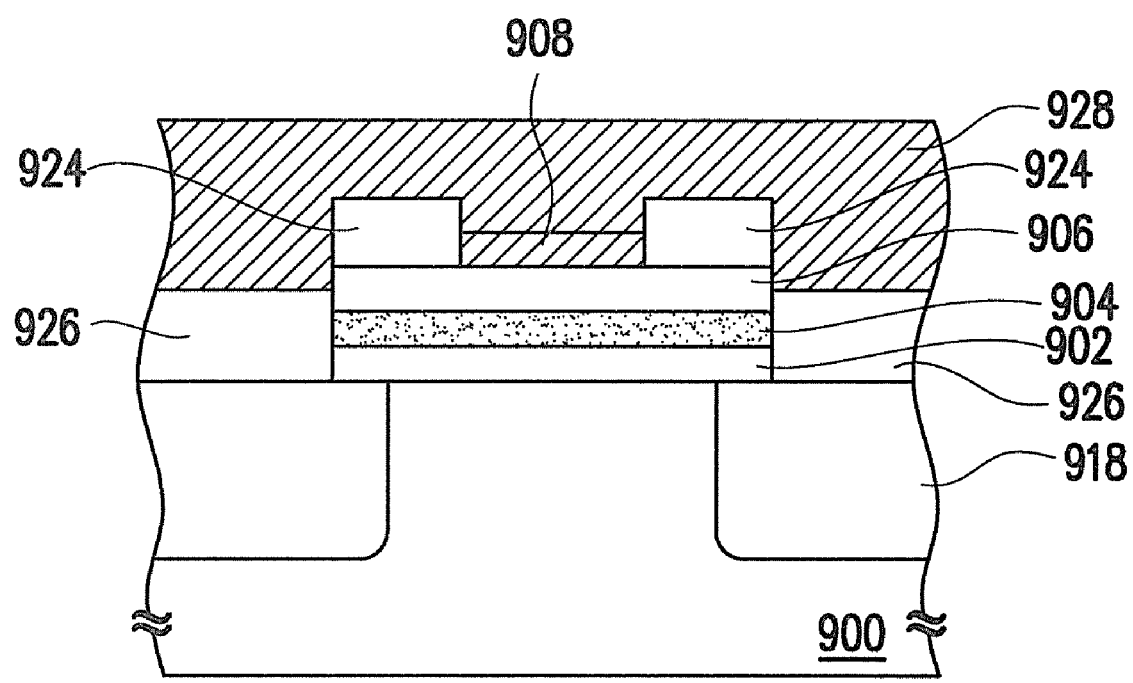

Thereafter, referring to FIG. 9G, a conductive layer 928 is formed on the insulating layer 924 and the consuming layer 908. A material of the conductive layer 928 is polysilicon, for example, and the conductive layer 928 is formed by performing the CVD process, for example. The fabrication of the non-volatile memory is then completed.

To sum up, in the present invention, the stacked structure comprising the insulating layer/the charge storage layer/the insulating layer is disposed between the conductive layer and the substrate. The insulating layer disposed between the conductive layer and the charge storage layer has a greater thickness of the peripheral region than the thickness of the internal region of the insulating layer. Accordingly, the thickness of the peripheral region of the insulating layer results in a greater DIBL, which effectively reduces the second-bit effect and resolves the problems derived therefrom. Moreover, the device reliability and the Vt window for operating the left bit and the right bit are increased. Furthermore, the non-volatile memory of the present invention can be applied to a multi-bit memory device as well.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for fabricating a non-volatile memory, the method comprising:
    forming a stacked structure and a consuming layer in sequence over a substrate;
    performing a converting process at a peripheral region of the consuming layer to form a first insulating layer on a top surface of the stacked structure wherein the converting process converting all of the peripheral region of the consuming layer which is exposed; and
    forming a conductive layer over the stacked layer and the first insulating layer.

2. The method for fabricating the non-volatile memory as claimed in claim 1, wherein the stacked structure comprises a second insulating layer and a charge storage layer formed in sequence over the substrate.

3. The method for fabricating the non-volatile memory as claimed in claim 2, before the conductive layer is formed, further comprising:
    removing the consuming layer; and
    forming a third insulating layer over the first insulating layer and the charge storage layer.

4. The method for fabricating the non-volatile memory as claimed in claim 2, wherein the stacked structure further comprises a third insulating layer located over the charge storage layer.

5. The method for fabricating the non-volatile memory as claimed in claim 4 wherein a thickness of the third insulating layer ranges from 80 angstrom to 100 angstrom, while a thickness of the first insulating layer ranges from 10 angstrom to 20 angstrom.

6. The method for fabricating the non-volatile memory as claimed in claim 2, wherein a thickness of the second insulating layer ranges from 50 angstrom to 60 angstrom.

7. The method for fabricating the non-volatile memory as claimed in claim 2, wherein a thickness of the charge storage layer ranges from 60 angstrom to 80 angstrom.

8. The method for fabricating the non-volatile memory as claimed in claim 2, wherein the charge storage layer is a dielectric material and the dielectric material providing charge trapping ability.

9. The method for fabricating the non-volatile memory as claimed in claim 8, wherein the dielectric material is nitride material that comprising silicon nitride.

10. The method for fabricating the non-volatile memory as claimed in claim 1, wherein the converting process is an oxidation process.

11. The method for fabricating the non-volatile memory as claimed in claim 1, further comprising:
    before the converting process is performed, forming a mask layer over a center region of the consuming layer; and after the converting process is performed, removing the mask layer.

12. The method for fabricating the non-volatile memory as claimed in claim 11, wherein the mask layer comprises silicon nitride.

13. The method for fabricating the non-volatile memory as claimed in claim 11, further comprising:
before the mask layer is removed, forming a fourth insulating layer on the first insulating layer.

14. The method for fabricating the non-volatile memory as claimed in claim 1, wherein the consuming layer is a conductive layer.

15. The method for fabricating the non-volatile memory as claimed in claim 14, wherein the consuming layer is a polysilicon layer.

* * * * *